US009225927B2

(12) United States Patent
Lococo et al.

(10) Patent No.: US 9,225,927 B2
(45) Date of Patent: Dec. 29, 2015

(54) AUTOMATIC GAIN CONTROL CIRCUIT

(75) Inventors: Luca Lococo, Anisy (FR); Francois Pichon, Caen (FR); Jan Van Sinderen, Liempde (NL)

(73) Assignee: NXP, B.V., Eindhoven (NL)

( * ) Notice: Subject to any disclaimer, the term of this patent is extended or adjusted under 35 U.S.C. 154(b) by 353 days.

(21) Appl. No.: 12/293,810

(22) PCT Filed: Mar. 21, 2007

(86) PCT No.: PCT/IB2007/050996
§ 371 (c)(1),
(2), (4) Date: Sep. 20, 2008

(87) PCT Pub. No.: WO2007/110816
PCT Pub. Date: Oct. 4, 2007

(65) Prior Publication Data
US 2010/0231801 A1    Sep. 16, 2010

(30) Foreign Application Priority Data

Mar. 24, 2006  (EP) .................................... 06300282

(51) Int. Cl.
*H04N 5/44*        (2011.01)
*H04N 5/52*        (2006.01)
*H03G 3/00*        (2006.01)
(52) U.S. Cl.
CPC .. *H04N 5/52* (2013.01); *H03G 3/00* (2013.01); *H04N 5/4446* (2013.01)
(58) Field of Classification Search
CPC ......... H04N 5/44; H04N 5/4446; H04N 5/52; H03G 3/3068; H03G 3/00
USPC ......... 348/725–733; 455/232.1, 234.1, 234.2, 455/239.1, 245.2, 247.1; 330/101, 107, 109
See application file for complete search history.

(56) References Cited

U.S. PATENT DOCUMENTS

| 5,940,143 A | * | 8/1999 | Igarashi et al. ............... 348/678 |
| 6,049,361 A | | 4/2000 | Kim |
| 6,134,430 A | | 10/2000 | Younis et al. |

(Continued)

FOREIGN PATENT DOCUMENTS

| CN | 1171694 A | 1/1998 |
| GB | 2 229 333 A | 9/1990 |

(Continued)

*Primary Examiner* — Michael Lee

(57) ABSTRACT

An automatic gain control (AGC) circuit based on a cascade of a step automatic gain control unit and a second automatic gain control unit connected to adjust their gain in a synchronized manner to result in a combined impulsive gain variation. Hereby it is possible, e.g. to use a step automatic gain control unit instead of a continuous automatic gain control unit in an RF part of a TV tuner without resulting in visual artifacts—this applies both for digital and analog TV tuners. According to a preferred embodiment, the synchronization between the two automatic gain control units may be achieved by the first automatic gain control unit generating a control signal upon gain adjustment, this control signal serving to speed up a loop bandwidth controlling gain change of the second automatic gain control unit. In another embodiment, the control signal generated by the first automatic gain control unit is used to control a gain step of the second automatic gain control unit. In addition, the invention provides a tuner with an automatic gain control unit as mentioned, and a device, e.g. a TV or a hard disc recorder with such tuner.

17 Claims, 4 Drawing Sheets

(56) References Cited

U.S. PATENT DOCUMENTS

| | | | |
|---|---|---|---|
| 6,496,017 B2 * | 12/2002 | Bhat | 324/616 |
| 6,625,433 B1 * | 9/2003 | Poirier et al. | 455/232.1 |
| 7,005,922 B2 * | 2/2006 | Oshima et al. | 330/278 |
| 7,212,798 B1 | 5/2007 | Adams et al. | |
| 2004/0062326 A1 | 4/2004 | Burke et al. | |
| 2005/0017427 A1 | 1/2005 | Delanghe et al. | |
| 2005/0174274 A1 | 8/2005 | Delanghe et al. | |
| 2006/0222115 A1 | 10/2006 | Dornbusch et al. | |
| 2010/0130153 A1 | 5/2010 | Khoini-Poorfard et al. | |

FOREIGN PATENT DOCUMENTS

| | | |
|---|---|---|
| GB | 2 307 121 A | 5/1997 |
| WO | 0158014 A | 8/2001 |
| WO | 2004038953 A | 5/2004 |
| WO | 2004086757 A1 | 10/2004 |

\* cited by examiner

AUTOMATIC GAIN CONTROL CIRCUIT

FIELD OF THE INVENTION

The present invention relates to the field of automatic gain controls.

BACKGROUND OF THE INVENTION

In wide band receivers for analog or digital TV, usually continuous Automatic Gain Controls (AGCs) are used in the RF receiver circuit to adapt to the level of the input signal. Continuous AGCs are used since use of step AGCs with a step size of e.g. 1 dB or larger will cause severe impairments to the image. In an analog TV an annoying glitch in the image will occur in case gain in the RF receiver circuit is adjusted in steps, whereas in a digital TV such stepwise adjustment of gain can in some cases result in a complete loss of the image when a gain step higher than 0.5 dB is used. Moreover, for multi-tuner applications a step of gain in one tuner can cause impairment in the image received by the second tuner. Thus, in multi-tuner applications a low noise amplifier with a fixed gain is normally used to provide a splitter function before the signal is delivered to the two or more tuners.

From a design point of view it is preferred for a number of reasons to implement a step AGC, since it is easier to meet the requirements in terms of low power consumption, low noise, together with a high linearity and gain with a step AGC than with a continuous AGC. In general, a step AGC allows a simpler design and a receiver with improved performance with respect to a number of parameters can be obtained.

WO 2004/086757 describes a TV tuner for receiving analog TV signals. The TV tuner includes a step AGC amplifier 1 that is adjusted in steps of 0.1, 0.5 or 1 dB only during a vertical synchronization interval in order not to generate severe visual artifacts in the image. In order to obtain this, the step AGC is adjusted based on a vertical synchronization signal v-sync provided by a separate circuit, namely an Intermediate Frequency (IF) demodulation circuit.

SUMMARY OF THE INVENTION

It is an object of the invention to provide an automatic gain control circuit, such as for use in a TV tuner, where it is possible to use a step AGC while still providing images without severe visual artifacts. The invention is defined by the independent claims. The dependent claims define advantageous embodiments.

A first aspect of the invention provides an automatic gain control (AGC) circuit comprising a cascade of a first AGC arranged to adjust its gain in steps, and a second AGC, wherein the first and second AGCs are connected so as to adjust their gains in a synchronized manner.

It is appreciated that by "cascade" is understood that the first and second AGCs can either be connected to directly follow each other, i.e. an output of the first AGC is directly connected to an input of the second AGC, or the first and second AGC can be connected in cascaded by indirectly following each other, i.e. another circuit may be interconnected between an output of the first AGC and an input of the second AGC.

The AGC circuit according to the first aspect is advantageous for example for incorporating into an RF part of a tuner, such as a TV tuner. By providing an AGC with a step AGC in cascade with a second AGC and synchronizing their gain adjustments, it is possible to obtain a combined gain variation that complies with the Digital Video Broadcasting-Terrestrial (DVB-T) requirements to acceptable input noise pulses. Thus, with the AGC circuit of the first aspect it is possible to implement a TV tuner using a step AGC with a gain step of more than 1 dB that still allows the tuner to receive digital TV signals without image artifacts. The AGC circuit can also be used for analog TV tuners where gain adjustment will only result in minor artifacts in the image.

Preferably, the first AGC is arranged to generate a control signal to the second AGC upon adjusting its gain. The second AGC is preferably arranged to adjust its gain in response to the control signal. In one embodiment the second AGC is arranged to adjust its gain in response to the control signal to counter act the adjustment of the first AGC. In another embodiment, the second AGC is arranged to speed up a rate of gain adjustment in response to the control signal.

Preferably, the first and second AGCs are synchronized such that, upon gain adjustment, a combined gain of the first and second AGCs exhibits an impulse variation. Preferably, the combined gain impulse variation complies with the DVB-T requirements with respect to allowable impulsive noise without picture failure. Thus, in such embodiment, the AGC circuit can be used for digital TV tuners without artifacts of the image.

In preferred embodiments, both the first and second AGCs are step type AGCs since the step AGCs have a number of advantages. However, the second AGC may be alternatively be arranged to adjust its gain continuously which can still be advantageous since the use in connection with the first AGC of a step type relaxes the requirements to the second AGC even though the second AGC is a continuous type AGC.

The second AGC can be implemented using a dual gate MOSFET, especially a dual gate MOSFET can be used to implement the second AGC of a continuous type.

In a second aspect, the invention provides a Radio Frequency (RF) tuner comprising at its input an automatic gain control circuit according to the first aspect. In some embodiments, at least a tracking filter is connected between the first and second AGCs. Even more parts of the RF tuner circuit, such as a mixer, may be connected between the first and second AGCs. In case the second AGC is connected after a mixer, it is preferred that it is a continuous gain AGC type.

For a multi-tuner application, the first step AGC may be connected at an input of a first tuner, whereas the second AGC is connected in relation to a second tuner. Thus, by splitting the two AGCs between the two tuners, it is possible to allow use of step AGCs in multi-tuner arrangements. Since the second tuner reacts upon gain change of the AGC in the first tuner, the first tuner can be seen as a master tuner for the second tuner. In general, this principle can be extended for multi tuners where on tuner acts as master for two or more slave tuners.

In a third aspect the invention provides a device comprising an RF tuner according to the second aspect. Especially, the device may be a TV set, either a digital TV set or an analog TV set. In case of an analog TV set, the automatic gain control circuit may be connected to synchronize its gain adjustment according to a vertical scan synchronization signal of the TV set, e.g. as disclosed in WO 2004/086757. Hereby it is possible to use the AGC circuit for receipt of analog TV signal without any visual artifacts in connection with gain adjustment. The device may in principle be any kind of device with an RF tuner, e.g. a hard disc recorder, a media center etc.

In a fourth aspect, the invention provides an automatic gain control method including adjusting gain of a first AGC in steps, and adjusting gain of a second AGC connected in cascade with the first AGC, wherein the adjustments of gain of the first and second AGC are performed in a synchronized manner.

It is appreciated that advantages and embodiments mentioned for the first aspect also apply for the second, third and fourth aspects of the invention. Thus, any one aspect of the present invention may each be combined with any of the other aspects.

BRIEF DESCRIPTION OF THE FIGURES

The present invention will now be explained, by way of example only, with reference to the accompanying Figures, where.

DETAILED DESCRIPTION OF EMBODIMENTS

Figure 1:
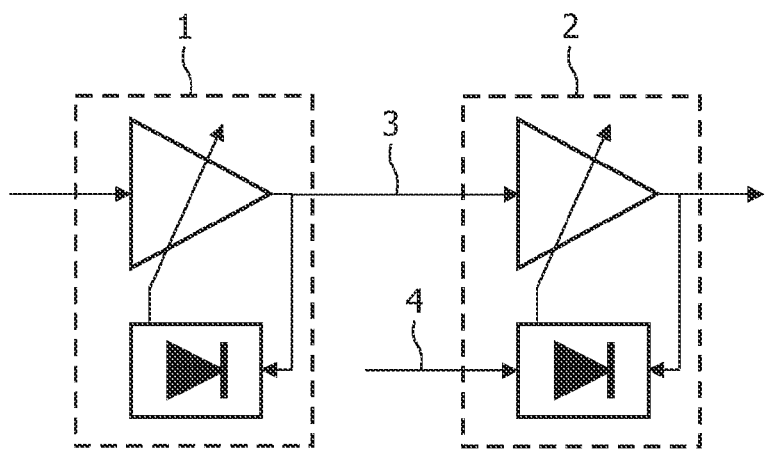
FIG. 1 illustrates a first embodiment of an automatic gain control circuit.

FIG. 1 shows a first AGC circuit embodiment according to the invention for use e.g. in an RF input part of a TV tuner. A first step AGC 1 is connected in cascade with a second AGC 2. The second AGC 2 may be either a continuous or a step type AGC with a small step size, e.g. of 0.5 dB or smaller. In the shown embodiment, the first and second AGCs 1, 2 are directly connected in cascade via connection 3. In addition, the first AGC 1 delivers a control signal 4 to the second AGC 2 when the first AGC1 changes its gain, thus the control signal 4 allows the two AGCs 1, 2 to synchronize their gain adjustments. The second AGC changes its gain slowly (i.e. it has a gain loop bandwidth in the range from a few Hertz to a few hundred Hertz) to cope with the field condition like disturbance of amplitude modulated unwanted signals that can disturb the wanted signal. However, by receiving the control signal 4, the loop bandwidth of the second AGC is increased, and thus the rate of gain change of the second AGC is speeded up in order to generate a fast counter gain step. The combined action of the first and second AGC will provide the desired gain response as shown by means of an example in the graphs of FIGS. 2a-2d.

Figure 2A:
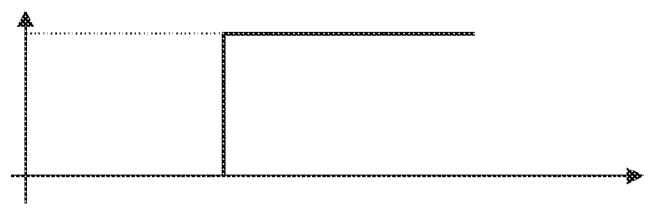
FIGS. 2a-2d illustrate graphs showing gain variations according to the first embodiment.
Figure 2B:
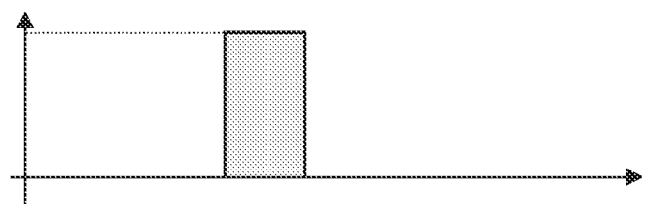
Figure 2C:
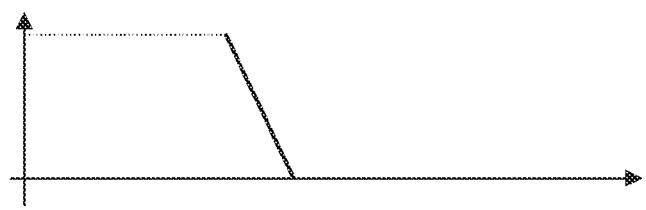

FIG. 2a shows a gain of the first AGC 1 as a function of time. As seen, the gain is adjusted one step upwards at a certain time. FIG. 2b shows the control or "speed up" signal 4, generated by the first AGC 1, as a function of time. As seen, this control signal 4 is "high" for a short period in connection with the gain adjustment of the first AGC. FIG. 2c indicates a gain variation of the second AGC as a function of time. As seen, the second AGC responds to the control signal 4 being "high" by decreasing the its gain. The result of the combined gain of the two AGCs 1, 2 is shown versus time in FIG. 2d. As seen, the increased gain of the first AGC 1 is counter acted by the decreased gain of the second AGC, and the result is an impulse variation in combined gain of the two AGCs and thereby by the total AGC circuit.

Figure 3:
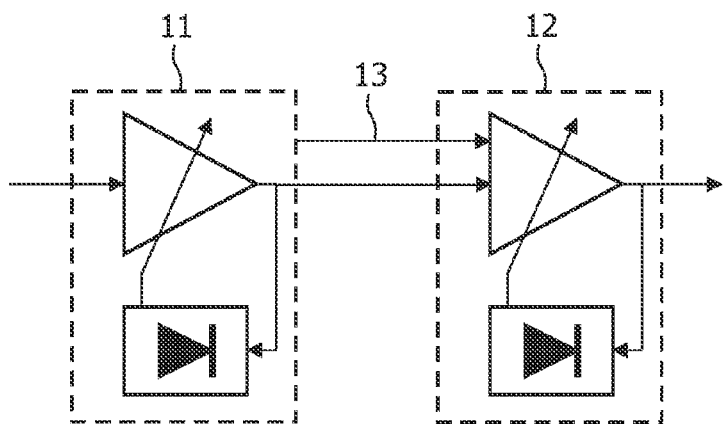
FIG. 3 illustrates a second embodiment of an automatic gain control circuit.

FIG. 3 illustrates another AGC circuit embodiment. Again, a step AGC 11 is connected in cascade with a second AGC 12 that can be a continuous AGC or a step AGC with a small gain step (smaller than 0.5 dB steps). In this embodiment the two AGCs 11, 12 are synchronized by a control signal 13 generated by the step AGC 11 and received by the second AGC 12 along with a change of gain of the step AGC 11. The second AGC 12 generates in response to the control signal 13 a counter gain step so as to counter act the gain step of the step AGC 11.

Figure 4A:
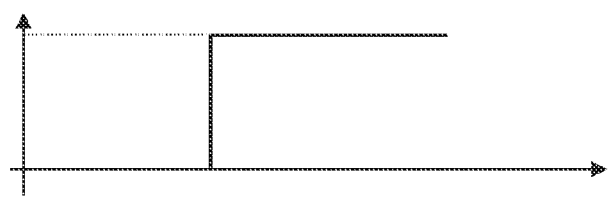
FIGS. 4a-4d illustrate graphs showing gain variations according to the second embodiment.
Figure 4B:
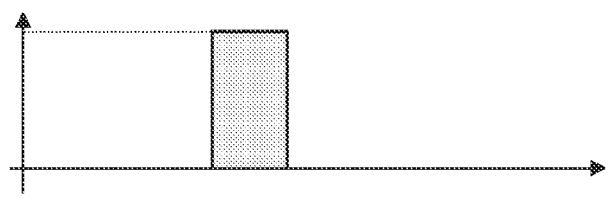
Figure 4C:
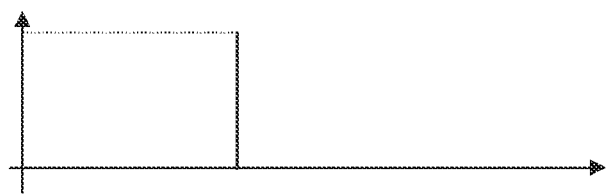
Figure 4D:
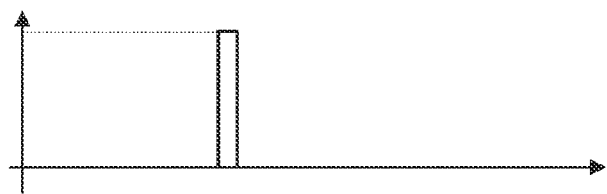

FIGS. 4a-4d illustrate an example of the gain variations and control signal 13 of the embodiment of FIG. 3. FIG. 4a illustrates a one step gain increase at a certain time for the step AGC 11. The control signal 13 generated by the step AGC 11 along with its gain variation is shown in FIG. 4b. The gain variation of the second AGC 12 in response to the control signal 13 is seen in FIG. 4c. As seen, the gain of the second AGC 12 is adjusted in one step in order to counter act the step of the step AGC 11. FIG. 4d illustrates the combined gain variation of the AGC circuit of FIG. 3. As seen, due to the second AGC 12 responding with its counter gain step delayed a short time compared to the initial gain step of the step AGC 11, the combined gain variation of the two AGCs 11, 12 is an impulse.

Figure 2D:
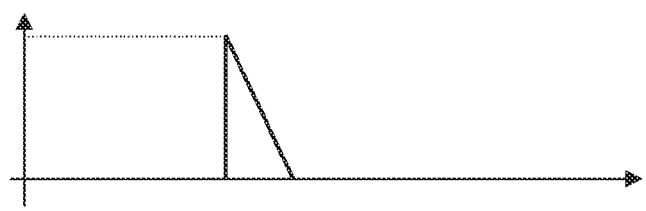

Considering the behavior of a Digital Video Broadcasting-Terrestrial (DVB-T) channel decoder, such channel decoder has to satisfy some requirements about impulsive noise (specified in D-book). It is specified that no picture failure is allowed to occur in case the channel decoder received impulsive noise where the duration and level of the impulse is below a specified range. For example a level of 15 dB is allowed for an impulse duration of 0.3 micro seconds, a level of 10 dB is allowed for an impulse duration of 1 micro second, and level of 5 dB is allowed in case the impulse duration is 2 micro second. The AGC circuit embodiments of the present invention exploit this behavior of the DVB-T decoders, since an AGC circuit with an impulse gain variation behavior as illustrated in FIGS. 2d and 4d satisfies the conditions of no picture failure in case it is used in an RF chain of a tuner for the reception of the digital TV, as long as the mentioned DVB-T conditions for the impulsive gain variation are met. These conditions can easily be achieved in practical embodiments. Thus, step AGCs can be used for an RF input part of a TV tuner for digital TV reception.

The AGC circuit embodiments can also be used for analog TV tuners. Here, the impulsive gain behavior will cause a luminance variation that is far less annoying than a glitch in the image, which will be the result of using a step AGC with a large step size in an RF part of a TV tuner for analog TV reception.

Figure 5:
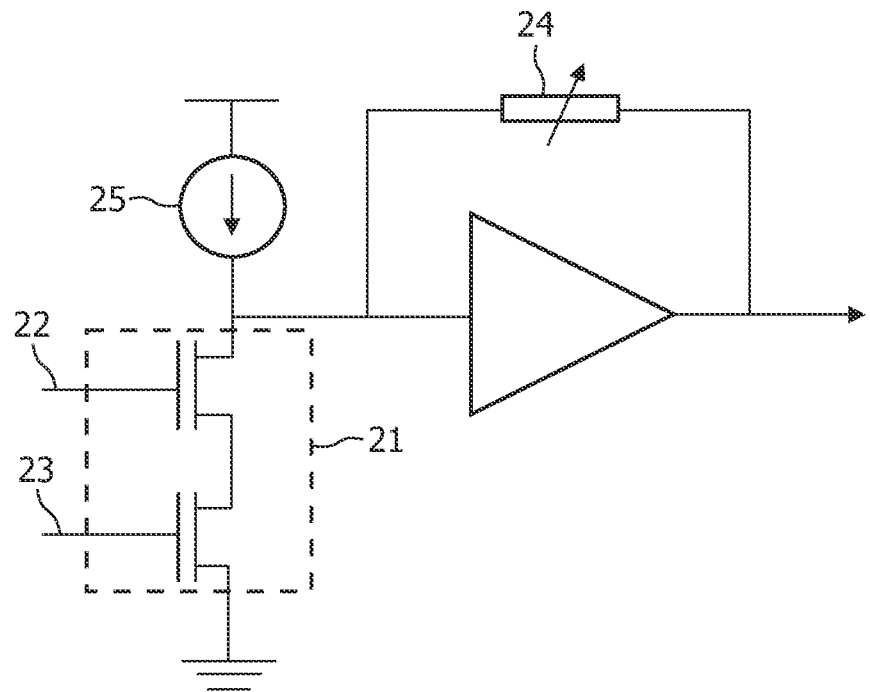
FIG. 5 illustrates a possible implementation of a continuous AGC element for use e.g. in the first or second AGC circuit embodiments.

FIG. 5 illustrates a possible implementation of a continuous AGC element that can be used as the second AGC for any of the AGC circuit embodiments of FIGS. 1 and 3. A current source 25 is connected to feed a MOSFET 21 with a dual gate 22, 23. The NMOST connected to the first gate 22 is used to change the drain voltage of the NMOS connected to 23. Then changing the drain voltage the current and the gm of the NMOST connected to the second gate 23 is changed. The resistance R of the variable resistor 24 determines together with the gm of the NMOST the voltage gain A of the entire circuit as A=R·gm. Thus, the voltage gain A can be adjusted by either changing the resistance R of the variable resistor 24 or by changing gm of the NMOST. Therefore, gate 22 is used as control signal input whereas gate 23 is used as AGC input.

Figure 6:
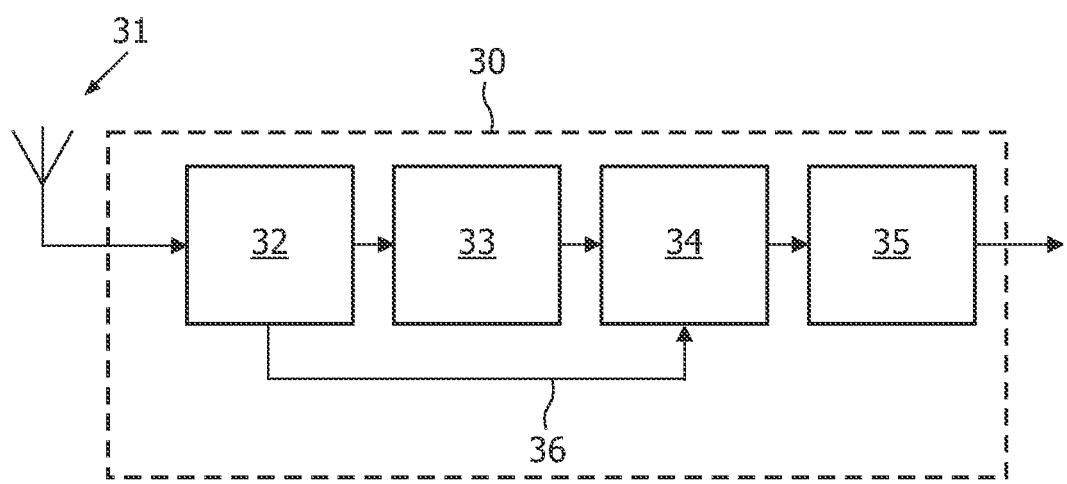
FIG. 6 illustrates an RF tuner embodiment according to the invention.

FIG. 6 illustrates an RF tuner embodiment 30 according to the invention where an AGC circuit 32, 34 according to the invention is used. An RF signal from an antenna 31 is received by a step AGC 32. This step AGC is connected in cascade with a second AGC 34, not directly since another tuner circuit part 33, including e.g. a tracking filter and a mixer, is connected between the two AGCs 32, 34. A control signal 36 serves to synchronize the two AGCs 32, 34 as described in connection with the embodiments of FIGS. 1 and 3. Possible further tuner circuits 35, e.g. an Intermediate Frequency (IF) filter, follow the second AGC 34. The tuner 30 can serve as a TV tuner, e.g. for integration into a TV set, and a hard disc recorder etc.

Figure 7:
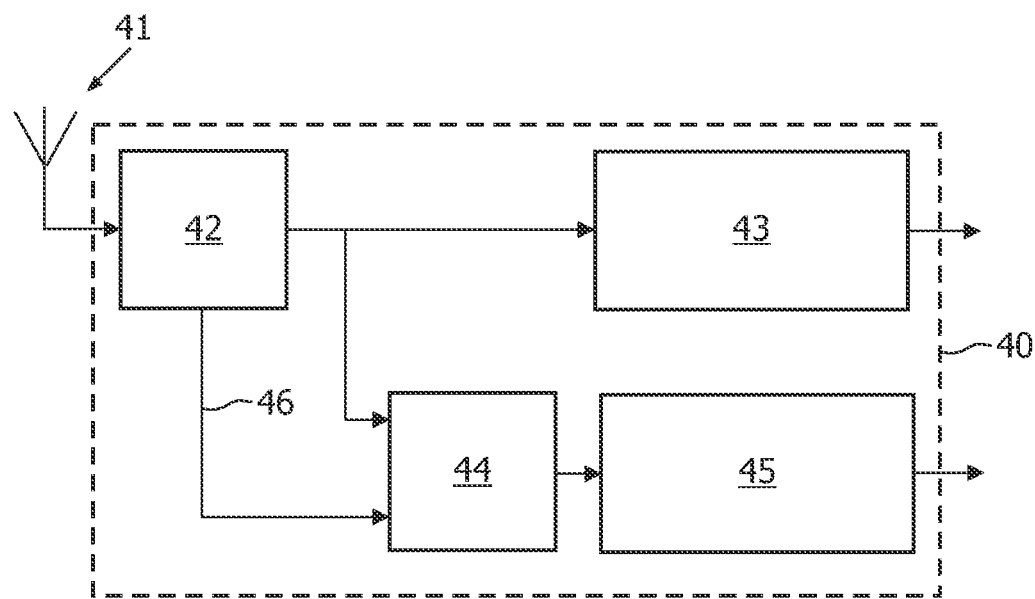
FIG. 7 illustrates a two-tuner embodiment according to the invention.

FIG. 7 illustrates a two-tuner embodiment 40. An RF signal from an antenna 41 is received by a step AGC 42. Output from the step AGC 42 is applied to further circuit 43 of a first tuner. In addition, the output of the step AGC 42 is applied to an input of a second AGC 44 whose output is connected to further circuit 45 of a second tuner. A control signal 46 serves to synchronize the two AGCs 42, 44 as described above. Thus, in order to avoid impairment of the image of the two-tuner embodiment 40, the AGC circuit is split between the two separate tuners so that a first tuner, the one with the step AGC 42, serves as a master while a second tuner, the one with the second AGC 44, serves a slave, i.e. the AGC 44 in the second tuner reacts to a gain step made by the step AGC 42 in the first tuner. As explained for one-tuner arrangements, the AGC 44 in the second tuner can in principle be connected anywhere in the second tuner circuit, i.e. it needs not to be inserted at an input of the second tuner.

It is appreciated that the same principle applies in general for multi-tuner arrangements, i.e. for three, four, five, six or more tuners coupled in a master-slave configuration. The speed up signal 4 or gain control signal 13 described for the embodiments of FIG. 1 or 3 must be provided to the slave tuners to avoid impairments of the resulting image.

Figure 8:
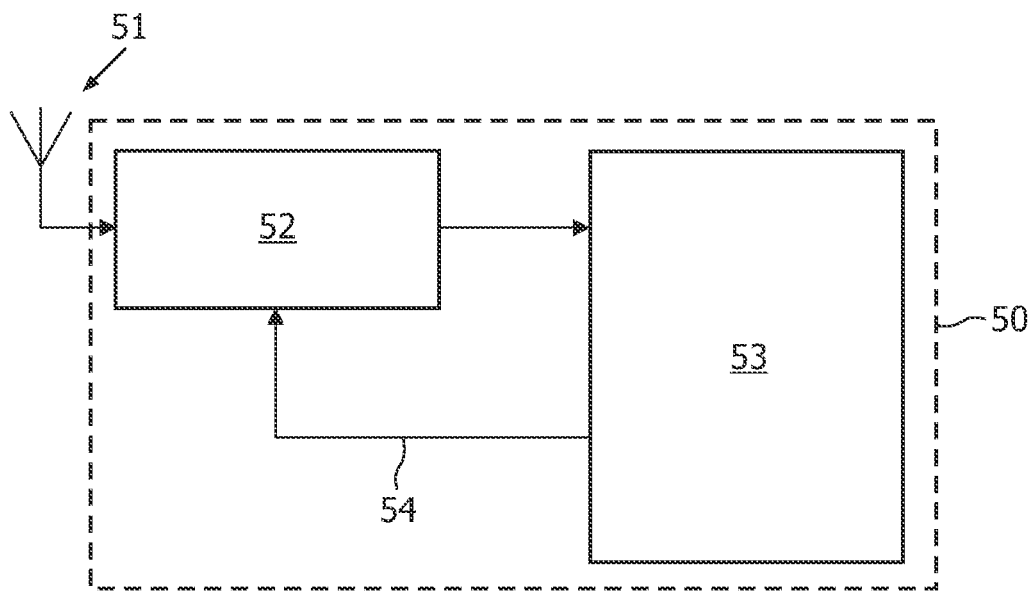
FIG. 8 illustrates a TV set according to the invention.

FIG. 8 illustrates an analog TV set 50 embodiment. An RF signal from antenna 51 is received by an RF tuner 52, e.g. the one illustrated in FIG. 6. Output of the tuner is applied to a display unit 53 of the TV set 50. A vertical synchronization signal 54 from the display unit 53 is applied to the tuner 52 in order to allow the AGC system of the tuner 52 to adjust gain only during a vertical synchronization interval, thereby eliminating a possible luminance variation of the produced image upon gain adjustment.

The elements and components of an embodiment of the invention may be physically, functionally and logically implemented in any suitable way. Indeed, the functionality may be implemented in a single unit, in a plurality of units or as part of other functional units. As such, the invention may be implemented in a single unit, or may be physically and functionally distributed between different units and processors.

In conclusion, the invention provides an AGC circuit based on a cascade of step AGC and a second AGC connected to adjust their gain in a synchronized manner to result in a combined impulsive gain variation. Hereby it is possible, e.g. to use a step AGC instead of a continuous AGC in an RF part of a TV tuner without resulting in visual artifacts—this applies both for digital and analog TV tuners. According to a preferred embodiment, the synchronization between the two AGCs may be achieved by the first AGC generating a control signal upon gain adjustment, this control signal serving to speed up a loop bandwidth controlling gain change of the second AGC. In another embodiment, the control signal generated by the first AGC is used to control a gain step of the second AGC. In addition, the invention provides a tuner with an AGC circuit as mentioned, and a device, e.g. a TV or a hard disc recorder with such tuner.

Although the present invention has been described in connection with the specified embodiments, it is not intended to be limited to the specific form set forth herein. Rather, the scope of the present invention is limited only by the accompanying claims. In the claims, the term "comprising" does not exclude the presence of other elements or steps. Additionally, although individual features may be included in different claims, these may possibly be advantageously combined, and the inclusion in different claims does not imply that a combination of features is not feasible and/or advantageous. In addition, singular references do not exclude a plurality. Thus, references to "a", "an", "first", "second" etc. do not preclude a plurality. Furthermore, reference signs in the claims shall not be construed as limiting the scope.

The invention claimed is:

1. An automatic gain control circuit comprising
a first automatic gain control unit arranged to adjust its gain in steps for operation on an input signal and to generate a control signal in response to an adjustment in the gain,
a second automatic gain control unit in cascade with the first automatic gain control unit configured and arranged to adjust its gain in response to the control signal and based upon a feedback signal and a range-limited loop bandwidth, and
wherein the first and second automatic gain control units are circuits connected so as to adjust their gains, in response to the control signal, in a synchronized manner by adjusting the loop bandwidth of the second automatic gain control unit, and wherein the first automatic gain control unit is arranged to adjust its gain in steps having a first size, the second automatic gain control unit is arranged to adjust its gain in steps having a second size that is less than the first size, and wherein the second size is adjusted in response to the control signal.

2. Automatic gain control circuit according to claim 1, wherein the first automatic gain control unit is arranged to generate the control signal to the second automatic gain control unit upon adjusting the gain of the first automatic gain control unit, and wherein the second automatic gain control unit is arranged with the first automatic gain control unit to adjust its loop bandwidth in response to the control signal and with a delay relative to the adjustment of the gain of the first automatic gain control unit, that provides a combined impulse gain variation.

3. Automatic gain control circuit according to claim 2, wherein
the first automatic gain control unit is configured and arranged to generate the control signal as a gate voltage, and
the second automatic gain control unit includes a transistor having a gate to which the gate voltage is applied and being configured and arranged to speed up a rate of gain adjustment in response to the control signal.

4. Automatic gain control circuit according to claim 2, wherein the second automatic gain control unit is arranged to adjust its loop bandwidth in response to the control signal to counteract the adjustment of the first automatic gain control unit.

5. Automatic gain control circuit according to claim 1, wherein the first and second automatic gain control units are synchronized such that, upon gain adjustment, a combined gain of the first and second automatic gain control units exhibits an impulse variation.

6. Automatic gain control circuit according to claim 1, wherein the second automatic gain control unit is arranged to adjust its gain continuously.

7. An automatic gain control circuit comprising
a first automatic gain control circuit arranged to adjust its gain in steps for operation on an input signal and to generate a control signal in response to an adjustment in the gain, and
a second automatic gain control circuit in cascade with the first automatic gain control circuit configured and arranged to adjust its gain in response to the control signal and based upon a feedback signal and a range-limited loop bandwidth,
wherein the first and second automatic gain control circuits are connected so as to adjust their gains, in response to the control signal, in a synchronized manner by adjusting the loop bandwidth of the second automatic gain control circuit, and wherein the second automatic gain control circuit includes a dual gate MOSFET that has a first gate that is configured to receive the control signal as input and a second gate that is configured to receive an output from the first automatic gain control circuit.

8. An RF tuner comprising:
an automatic gain control circuit including a first automatic gain control unit arranged to adjust its gain in steps for operation on an input signal and to provide a control signal, and
a second automatic gain control unit in cascade with the first automatic gain control unit and configured and arranged to adjust its gain based upon a feedback signal and according to a range-limited loop bandwidth, wherein the first and second automatic gain control units are circuits connected so as to adjust their gains in a synchronized manner according to the control signal by adjusting the loop bandwidth of the second automatic gain control unit; and
a mixer configured and arranged as part of a first tuner or a second tuner, wherein the first automatic gain control unit is connected at an input of the first tuner, and wherein the second automatic gain control unit is connected to the second tuner.

9. RF tuner according to claim 8, wherein at least a tracking filter is connected between the first and second automatic gain control units.

10. An RF tuner comprising:
an automatic gain control circuit including a first automatic gain control unit arranged to adjust its gain in steps for operation on an input signal and to provide a control signal, and
a second automatic gain control unit in cascade with the first automatic gain control unit and configured and arranged to adjust its gain based upon a feedback signal and according to a range-limited loop bandwidth, wherein the first and second automatic gain control units are circuits connected so as to adjust their gains in a synchronized manner according to the control signal by adjusting the loop bandwidth of the second automatic gain control unit; and
a mixer; wherein
the second automatic gain control unit includes a transistor that adjusts the loop bandwidth and a feedback loop that provides feedback from an output of the second automatic gain control unit, and
the first automatic gain control is configured and arranged to generate the control signal as a gate voltage that is applied to a gate of the transistor.

11. A device according to claim 10, the device being a TV set, wherein the automatic gain control circuit is connected to synchronize its gain adjustment according to a vertical scan synchronization signal of the TV set.

12. An automatic gain control method including
adjusting gain of a first automatic gain control circuit in steps automatically by operation of the first automatic gain control circuit, and
adjusting gain of a second automatic gain control circuit connected in cascade with the first automatic gain control circuit in response to a feedback signal from an output of the second automatic gain control circuit and according to a range-limited loop bandwidth,
wherein the adjustments of gain of the first and second automatic gain control circuits are performed in a synchronized manner, by altering a loop bandwidth of the second automatic gain control circuit, in response to a control signal received from the first automatic gain control circuit, and wherein the first automatic gain control circuit is arranged to adjust its gain in steps having a first size, the second automatic gain control circuit is arranged to adjust its gain in steps having a second size that is less than the first size, and wherein the second size is adjusted in response to the control signal.

13. An automatic gain control circuit comprising
a first automatic gain control unit arranged to adjust its gain in steps, and
a second automatic gain control unit in cascade with the first automatic gain control unit and configured and arranged to adjust its gain based upon a feedback signal and a range-limited loop bandwidth,
wherein the first and second automatic gain control units are circuits connected so as to adjust their gains in a synchronized manner, and
wherein the first automatic gain control unit is configured and arranged to, in response to the gain of the first automatic gain control unit being adjusted, generate a control signal configured for adjusting the gain of the second automatic gain control unit by altering its loop bandwidth in response to the control signal, and communicate the control signal to the second automatic gain control unit to set the gain of the second automatic gain control unit, the second automatic gain control unit being configured and arranged to set its gain in response to the control signal, wherein the first automatic gain control unit is connected at an input of a first tuner, and wherein the second automatic gain control unit is connected to a second tuner.

14. The automatic gain control circuit of claim 1, wherein the automatic gain control circuit is connected to a television set and a combined gain of the first and second automatic gain control units exhibits an impulse variation causing luminance variation in an image provided to the television set.

15. The RF tuner of claim 8, wherein the automatic gain control circuit is connected to a television set and a combined gain of the first and second automatic gain control units exhibits an impulse variation causing luminance variation in an image provided to the television set.

16. The method of claim 12, further including
utilizing the first automatic gain control circuit and the second automatic gain control circuit as an RF input part of a TV tuner for digital TV reception; and
causing luminance variation to an image provided as a part of digital TV reception based on a combined gain of the first and second automatic gain control circuits.

17. The automatic gain control circuit of claim 13, wherein the automatic gain control circuit is connected to a television set and a combined gain of the first and second automatic gain control circuits is configured and arranged to exhibit an impulse variation causing luminance variation in an image provided to the television set, and the second automatic gain control unit includes a transistor having a gate connected to receive the control signal, the transistor being configured and arranged to speed up a rate of gain adjustment in the second automatic gain control unit in response to the control signal.

\* \* \* \* \*